(12) United States Patent
Park et al.

(10) Patent No.: US 7,332,412 B2
(45) Date of Patent: Feb. 19, 2008

(54) STRUCTURE OF STRAINED SILICON ON INSULATOR AND METHOD OF MANUFACTURING THE SAME

(75) Inventors: Young-soo Park, Gyeonggi-do (KR); Wenxu Xianyu, Gyeonggi-do (KR); Takashi Noguchi, Gyeonggi-do (KR)

(73) Assignee: Samsung Electronics Co., Ltd., Suwon-Si, Gyeonggi-Do (KR)

( * ) Notice: Subject to any disclaimer, the term of this patent is extended or adjusted under 35 U.S.C. 154(b) by 0 days.

(21) Appl. No.: 11/071,150

(22) Filed: Mar. 4, 2005

(65) Prior Publication Data

US 2006/0118870 A1    Jun. 8, 2006

(30) Foreign Application Priority Data

Dec. 8, 2004  (KR) ............... 10-2004-0103111

(51) Int. Cl.
*H01L 21/30*    (2006.01)

(52) U.S. Cl. ............... 438/458; 438/479; 438/517; 257/19; 257/E21.57; 257/E29.298

(58) Field of Classification Search ........... 257/19, 257/E21.57, E29.298; 438/479, 517, 458
See application file for complete search history.

(56) References Cited

U.S. PATENT DOCUMENTS

| 5,013,681 | A | 5/1991 | Godbey et al. | |
| 6,059,895 | A | 5/2000 | Chu et al. | |
| 6,541,347 | B2 * | 4/2003 | Tsai et al. | 438/392 |
| 6,649,492 | B2 * | 11/2003 | Chu et al. | 438/478 |
| 6,953,736 | B2 * | 10/2005 | Ghyselen et al. | 438/458 |
| 2003/0003687 | A1 * | 1/2003 | Yanagita et al. | 438/458 |
| 2004/0245571 | A1 * | 12/2004 | Cheng et al. | 257/347 |

OTHER PUBLICATIONS

Korean Patent Office Action dated Feb. 20, 2006.

* cited by examiner

*Primary Examiner*—Andy Huynh
(74) *Attorney, Agent, or Firm*—Buchanan Ingersoll & Rooney PC (57) ABSTRACT

Provided is a strained SOI structure and a method of manufacturing the strained SOI structure. The strained SOI structure includes an insulating substrate, a $SiO_2$ layer formed on the insulating substrate, and a strained silicon layer formed on the $SiO_2$ layer.

8 Claims, 12 Drawing Sheets

STRUCTURE OF STRAINED SILICON ON INSULATOR AND METHOD OF MANUFACTURING THE SAME

CROSS-REFERENCE TO RELATED PATENT APPLICATIONS

Priority is claimed to Korean Patent Application No. 10-2004-00103111, filed on Dec. 8, 2004, in the Korean Intellectual Property Office, the disclosure of which is incorporated herein in its entirety by reference.

BACKGROUND OF THE INVENTION

1. Field of the Invention

The present invention relates to a strained silicon on insulator (strained SOI) structure and a method of manufacturing the same, and more particularly, to a strained SOI structure having a small parasitic capacitance and high carrier mobility and a method of manufacturing the same.

2. Description of the Related Art

A strained silicon CMOS is a CMOS device that includes a thin, strained silicon layer on a relaxed SiGe layer. The mobility of electrons and holes within the strained silicon layer is known to be much higher than with a bulk silicon layer, and devices manufactured using a MOFET having a strained silicon channel have improved device performances compared to devices manufactured using a conventional (unstrained silicon) silicon substrate. The potential performance improvement of devices increases device driving current and mutual conductance and reduces power consumption.

The formation of the strained silicon layer is the result of tensile strain occurs on silicon grown on a substrate formed of a material having a greater lattice constant than the lattice constant of the silicon. The lattice constant of germanium Ge is approximately 4.2 which is greater than the lattice constant of silicon, and the lattice constant of silicon-germanium SiGe is linear to the concentration of germanium Ge. That is, the lattice constant of SiGe that contains 50% Ge is 1.02 times greater than the lattice constant of silicon. The epitaxial growth of silicon on a SiGe substrate generates the tensile strain of a silicon layer, and the SiGe substrate underneath the silicon layer is in a non-strained or relaxed state.

A method of forming a CMOS device having a strained silicon channel on a SiGe layer formed on an insulating substrate is disclosed in U.S. Pat. No. 6,059,895.

The difficulty in implementing the advantages of the strained silicon CMOS technique is the presence of a relaxed SiGe layer underneath the strained silicon layer. The SiGe layer interacts with the strained silicon layer in the processes of thermal oxidation, forming silicide, and annealing. Therefore, the improvement of device performance and a device yield that can be achieved may be limited during manufacturing a CMOS due to the difficulty of maintaining an integrity of material. Another disadvantage is that the thickness of the SiGe layer is added to the total thickness of a MOSFET main body. The addition of a thickness to the MOSFET is especially undesirable to the SOIFET structure since the additional thickness affects adversely to the super slim SOI device in which a MOSFET structure having a very thin channel is included.

SUMMARY OF THE INVENTION

The present invention provides a strained silicon on insulator (strained SOI) structure having a small parasitic capacitance and high carrier mobility and a method of manufacturing the same.

According to an aspect of the present invention, there is provided a strained SOI structure comprising: an insulating substrate; a $SiO_2$ layer formed on the insulating substrate; and a strained silicon layer formed on the $SiO_2$ layer.

The strained SOI structure can further comprise a bonding layer between the insulating substrate and the $SiO_2$ layer, and the bonding layer can be formed one of $SiO_2$ and polycrystalline silicon.

The insulating substrate can be a substrate selected from the group consisting of a glass substrate, a plastic substrate, and a Si substrate on which an oxide layer is formed. The strained SOI structure can further comprise a protective layer that surrounds the insulating substrate and the protective layer can be formed of AlN.

According to another aspect of the present invention, there is provided a method of manufacturing a strained SOI structure, comprising: preparing a Si substrate and an insulating substrate; forming a porous silicon layer by anodizing a predetermined thickness of the Si substrate; forming a SiGe layer on the porous silicon layer; forming a strained silicon layer on the SiGe layer; forming a $SiO_2$ layer on the strained silicon layer; activating a surface of the $SiO_2$ layer by treating the surface of the $SiO_2$ layer using oxygen $O_2$ plasma; bonding the insulating substrate on the activated $SiO_2$ layer; removing the SiGe layer by selectively etching after reversing the stacked structure so that the insulating substrate is placed on a lower position; and separating the porous silicon layer and the Si substrate from the strained silicon layer.

According to another aspect of the present invention, there is provided a method of manufacturing a strained SOI structure, comprising: preparing a Si substrate and an insulating substrate; forming a SiGe layer on the Si substrate; forming a porous SiGe layer by anodizing a predetermined thickness of the SiGe layer; forming a strained silicon layer on the porous SiGe layer; forming a $SiO_2$ layer on the strained silicon layer; activating a surface of the $SiO_2$ layer by treating the surface of the $SiO_2$ layer using oxygen $O_2$ plasma; bonding the insulating substrate on the activated $SiO_2$ layer; removing the porous SiGe layer by selectively etching after reversing the stacked structure so that the insulating substrate is placed on a lower position; and separating the Si substrate from the strained silicon layer.

The insulating substrate can be a substrate selected from the group consisting of a glass substrate, a plastic substrate, and a Si substrate on which an oxide layer is formed.

The preparing of the insulating substrate can include preparing an insulating substrate and forming a protective layer on a surface of the insulating substrate. Here, the protective layer is formed of AlN.

The preparing of the insulating substrate can include preparing an insulating substrate, forming a protective layer on a surface of the insulating substrate, and forming a bonding layer on the protective layer. Here, the bonding layer can be formed one of $SiO_2$ and polycrystalline silicon.

According to another aspect of the present invention, there is provided a method of manufacturing a strained SOI structure, comprising: preparing a Si substrate and an insulating substrate; forming a $SiO_2$ layer on the Si substrate; forming at least two $SiO_2$ barrier ribs spaced a predetermined distance from each other by patterning the $SiO_2$ layer;

forming a SiGe layer on the Si substrate between the two barrier ribs; forming a strained silicon layer on the SiGe layer; removing the $SiO_2$ barrier ribs; bonding the insulating substrate on the strained silicon layer; removing the SiGe layer by selectively etching after reversing the stacked structure so that the insulating substrate is placed on a lower position; and separating the Si substrate from the strained silicon layer.

The insulating substrate can be a substrate selected from the group consisting of a glass substrate, a plastic substrate, and a Si substrate on which an oxide layer is formed.

The preparing of the insulating substrate can include preparing an insulating substrate and forming a protective layer on a surface of the insulating substrate. Here, the protective layer is formed of AlN.

The preparing of the insulating substrate can include preparing an insulating substrate, forming a protective layer on a surface of the insulating substrate, and forming a bonding layer on the protective layer.

Here, the bonding of the insulating substrate on the strained silicon layer can includes activating a surface of the bonding layer by treating using oxygen $O_2$ plasma and bonding the insulating substrate on the strained silicon layer. The bonding layer can be formed one of $SiO_2$ and polycrystalline silicon.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

A strained SOI structure and a method of manufacturing the strained SOI structure will now be described more fully with reference to the accompanying drawings in which exemplary embodiments of the invention are shown.

Figure 1:
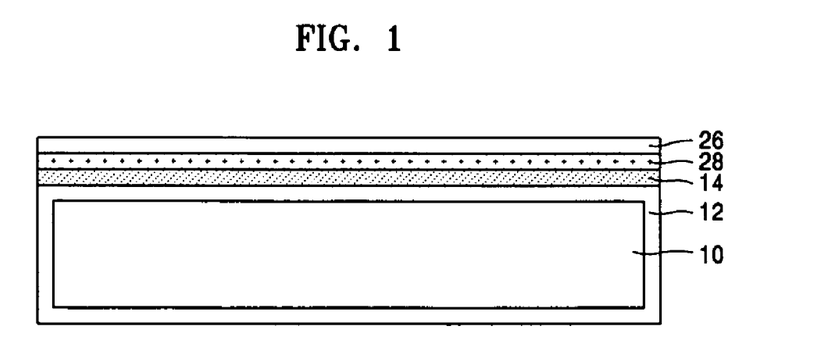
FIG. 1 is a cross-sectional view of a strained SOI structure according to an embodiment of the present invention.

FIG. 1 is a cross-sectional view of a strained SOI structure according to an embodiment of the present invention.

Referring to FIG. 1, a protective layer 12 that surround an insulating substrate 10, a bonding layer 14 formed on the protective layer 12, a $SiO_2$ layer 28, and a strained silicon layer 26 are sequentially formed on the insulating substrate 10. The protective layer 12 and the bonding layer 14 are not requisite layers.

The insulating substrate 10 is a substrate selected from the group consisting of a glass substrate, a plastic substrate, and an oxide layer. Also, the protective layer 12 is formed of a material having characteristics of insulating, transparent, and resisting to an etchant, such as AlN. The bonding layer 14 is formed of $SiO_2$ or polycrystalline silicon.

A strained SOI structure formed on the insulating substrate 10 has high performance, small parasitic capacitance, and high carrier mobility. Especially, the strained SOI structure can be applied to a front panel or a rear panel of a display panel by using a plastic substrate or a glass substrate as the insulating substrate 10.

FIGS. 2A through 2L are cross-sectional views illustrating a method of manufacturing a strained SOI structure according to a first embodiment of the present invention. Here, like reference numerals refer to like elements throughout the drawings. The formation of material layers during the processes is formed using a well known thin film deposition apparatus such as ultra high vacuum chemical vapor deposition (UHV-CVD) or low pressure chemical vapor deposition (LPCVD).

Figure 2A:
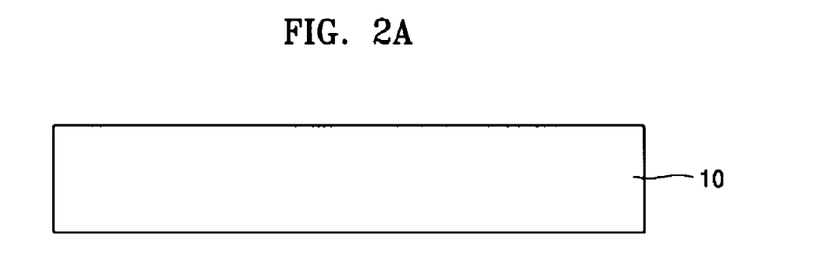
FIGS. 2A through 2L are cross-sectional views illustrating a method of manufacturing a strained SOI structure according to a first embodiment of the present invention.
Figure 2B:
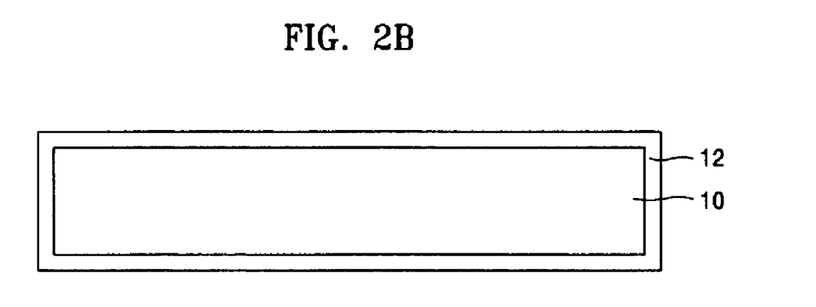
Figure 2C:
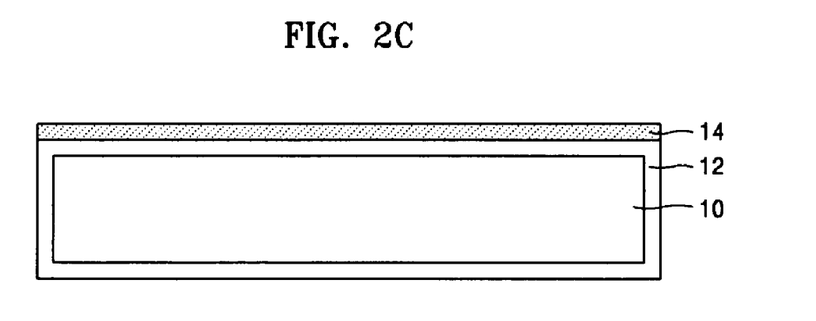
Figure 2D:
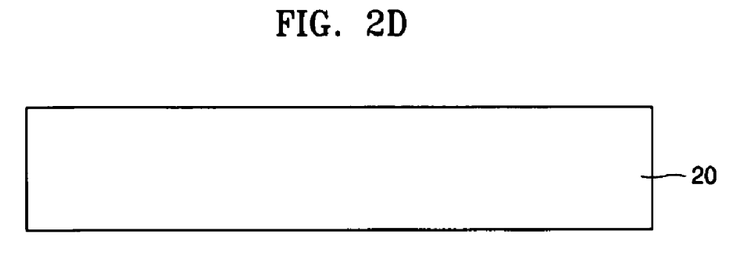
Figure 2E:
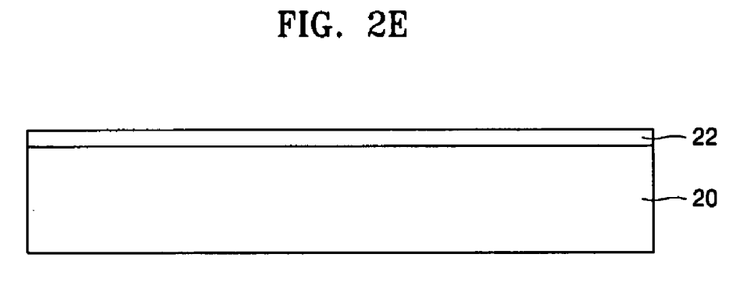
Figure 2F:
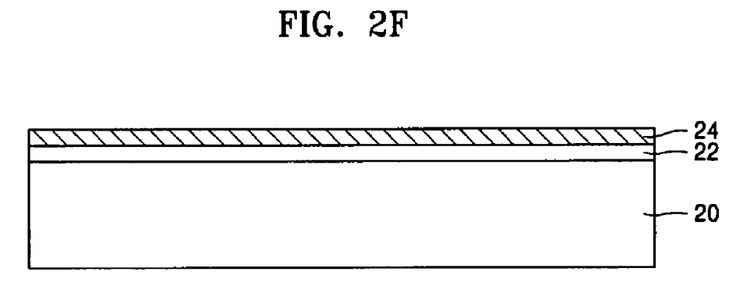
Figure 2G:
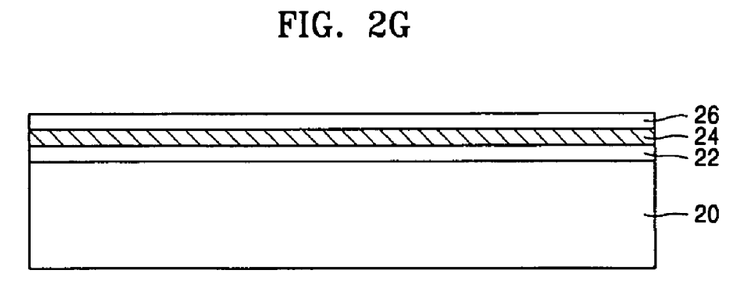
Figure 2H:
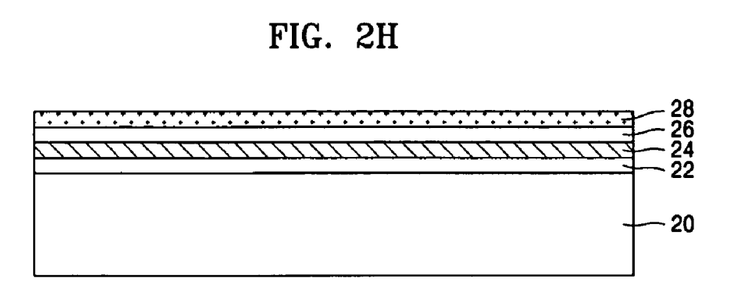
Figure 2I:
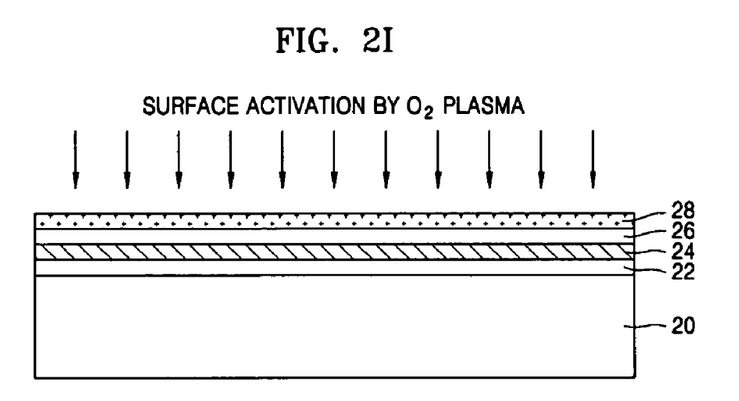
Figure 2J:
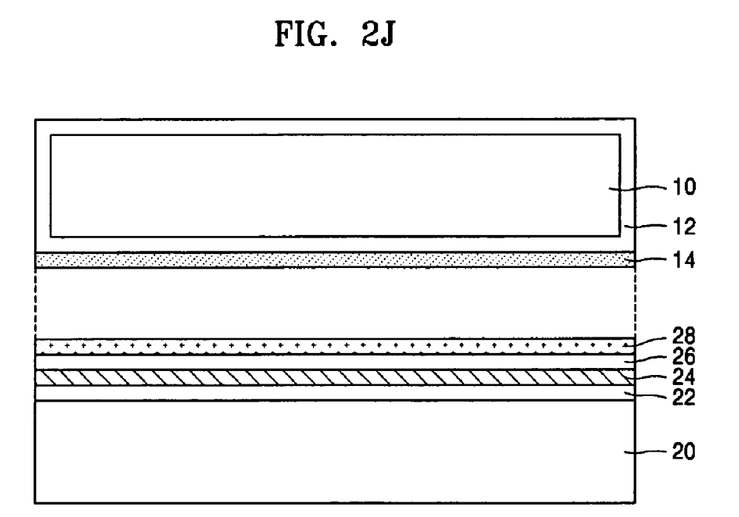
Figure 2K:
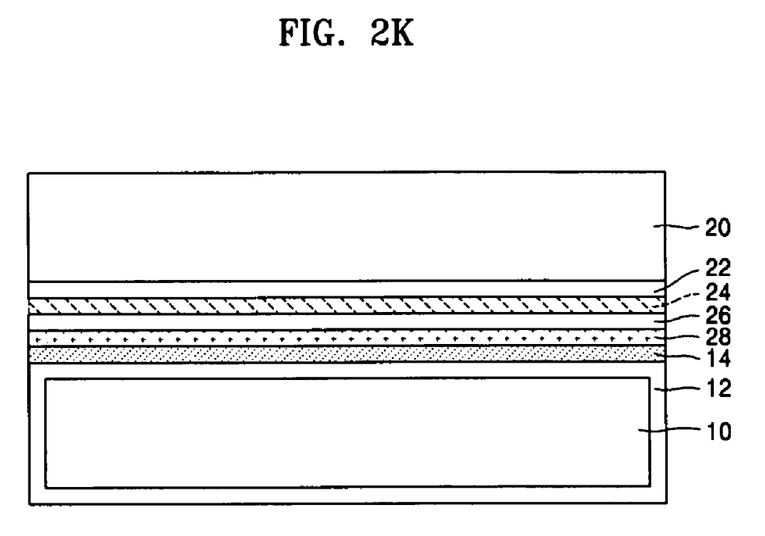

Referring to FIGS. 2A through 2C, a protective layer 12 is formed on a surface of an insulating substrate 10. The protective layer 12 is formed of a material having characteristics of insulating, transparent, and resistance to an etchant, such as AlN. Next, a bonding layer 14 formed of a material, such as $SiO_2$ or polycrystalline silicon, is formed on the protective layer 12. Here, the protective layer 12 and the bonding layer 14 are not requisite layers.

Referring to FIGS. 2D through 2H, after preparing a Si substrate 20, a porous silicon layer 22 is formed by anodizing a predetermined thickness of the Si substrate 20. To form the porous silicon layer 22, a predetermined thickness of the Si substrate 20 is anodized electrochemically in a mixed solution of fluoride hydrogen HF and ethanol.

Afterward, a SiGe layer 24, a strained silicon layer 26, and a $SiO_2$ layer 28 are sequentially formed on the porous silicon layer 22. Here, the SiGe layer 24 has a relaxed structure. Accordingly, the strained silicon layer 26 can be formed on the SiGe layer 24.

Referring to FIGS. 2I through 2L, a surface of the $SiO_2$ layer 28 is activated by treating the surface using oxygen $O_2$ plasma. Next, the prepared insulating substrate 10 is bonded on the activated $SiO_2$ layer 28. Here, a surface of the bonding layer 14 formed on the insulating substrate 10 can be activated by treating the surface using oxygen $O_2$ plasma prior to bond the insulating substrate 10.

Next, the stacked structure is reversed so that the insulating substrate 10 can be placed in a lower position. Next, the SiGe layer 24 is removed by selective etching. Here, an etchant for selectively etching the SiGe layer 24 is a mixed solution of 50% HF:60% $HNO_3$:$H_2O$=1:90~120:60. Other etchants that can selectively etch the SiGe layer 24 can also be used. Here, the echant readily reacts with the SiGe layer 24 not only on both side surfaces but also through the porous silicon layer 22 by being absorbed by the porous silicon layer 22.

Figure 2L:
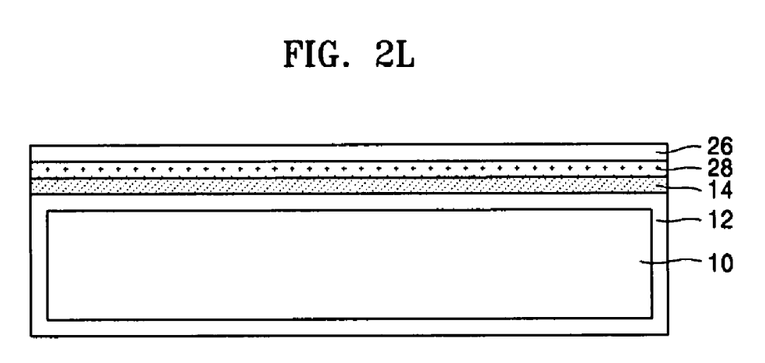

The porous silicon layer 22 and the Si substrate 20 formed on the SiGe layer 24 can be separated from the strained silicon layer 26 by selectively removing the SiGe layer 24. As a result, as depicted in FIG. 2L, a strained SOI structure formed on the insulating substrate 10 can be obtained.

FIGS. 3A through 3L are cross-sectional views illustrating a method of manufacturing a strained SOI structure according to a second embodiment of the present invention. Here, like reference numerals refer to like elements throughout the drawings. The formation of material layers during the processes is formed using a well known thin film deposition apparatus such as UHV-CVD or LPCVD.

Figure 3A:
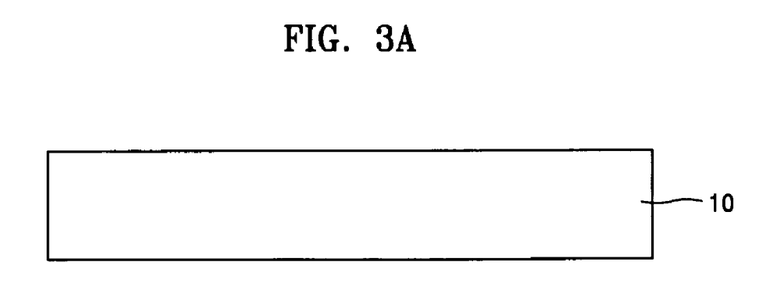
FIGS. 3A through 3L are cross-sectional views illustrating a method of manufacturing a strained SOI structure according to a second embodiment of the present invention.
Figure 3B:
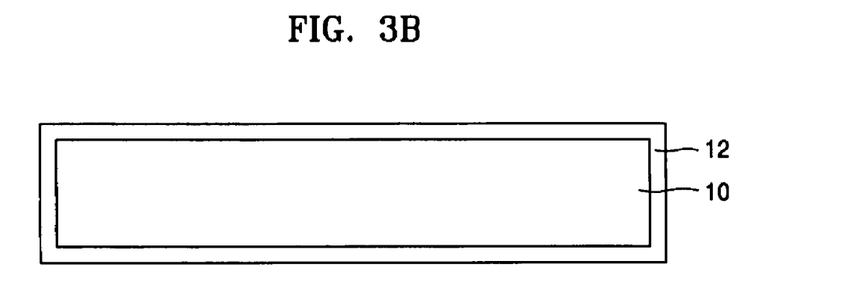
Figure 3C:
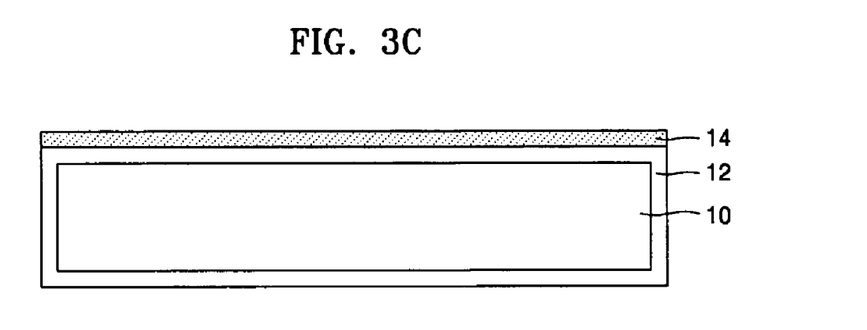
Figure 3D:
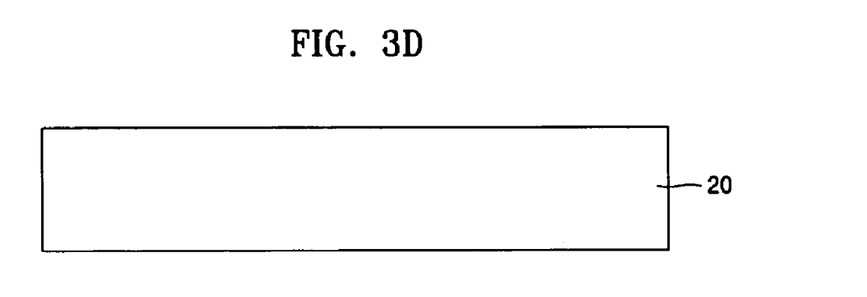
Figure 3E:
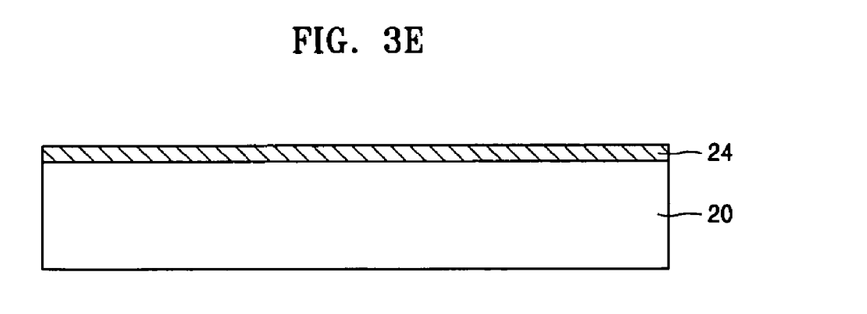
Figure 3F:
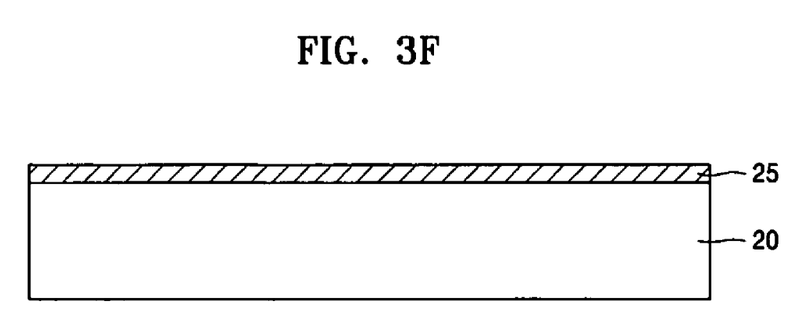
Figure 3G:
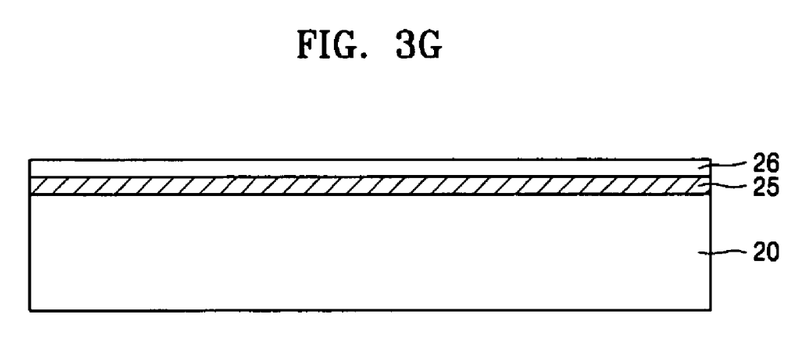
Figure 3H:
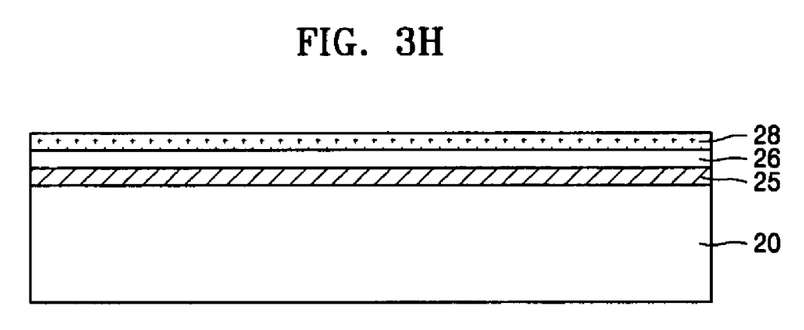
Figure 3I:
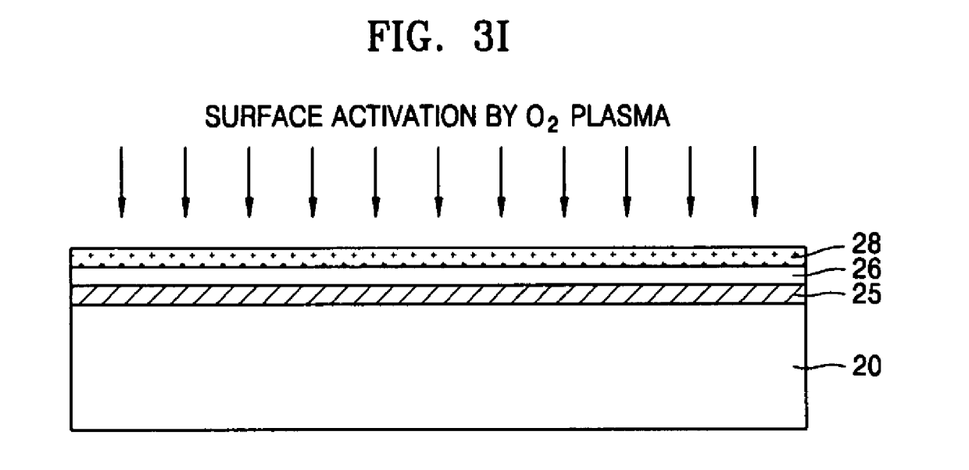
Figure 3J:
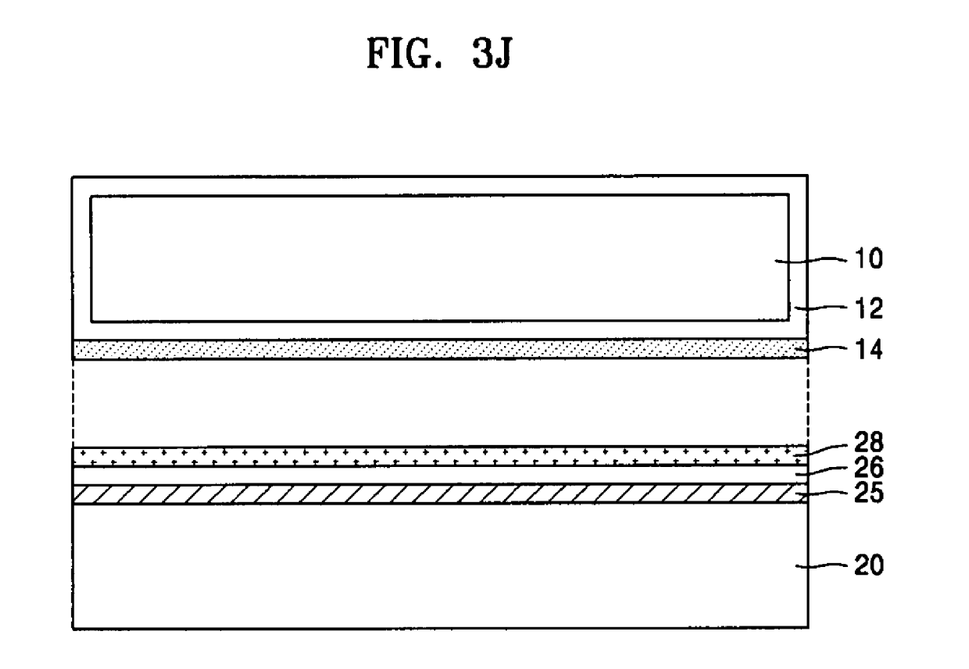
Figure 3K:
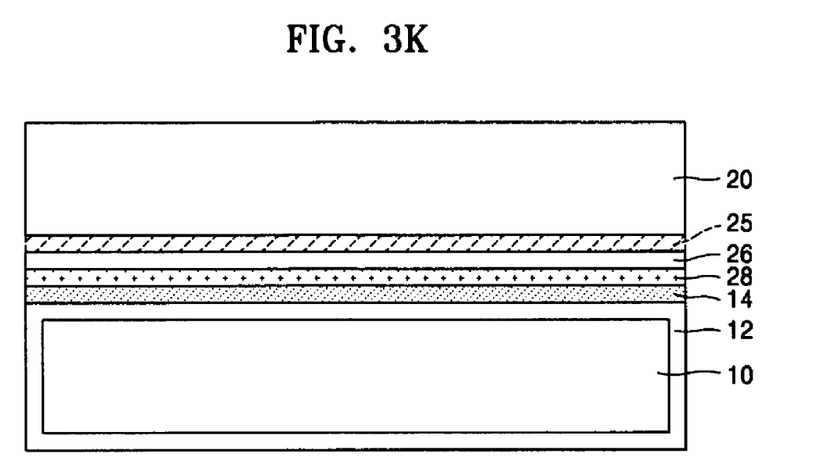

Referring FIGS. 3A through 3C, after preparing an insulating substrate 10, a protective layer 12 is formed on the insulating substrate 10. The protective layer 12 is formed of a material having characteristics of insulating, transparent, and resistance to an etchant such as AlN. A bonding layer 14 formed of SiO2 or polycrystalline silicon is formed on the protective layer 12. The protective layer 12 and the bonding layer 14 are not requisite.

Referring to FIGS. 3D through 3H, after preparing the Si substrate 20, a SiGe layer 24 having a predetermined thickness is formed on the Si substrate 20. Here, the SiGe layer 24 has a relaxed structure. Next, a porous SiGe layer 25 is formed by anodizing the SiGe layer 24. To form the porous SiGe layer 25, a predetermined thickness of the porous SiGe layer 25 is anodized electrochemically in a mixed solution of fluoride hydrogen HF and ethanol.

Next, the strained silicon layer 26 and the $SiO_2$ layer 28 are sequentially formed on the porous SiGe layer 25.

Referring to FIGS. 3I through 3L, a surface of the $SiO_2$ layer 28 is activated by treating the surface using oxygen $O_2$ plasma. Next, the prepared insulating substrate 10 is bonded on the activated $SiO_2$ layer 28. Here, a surface of the bonding layer 14 formed on the insulating substrate 10 can be activated by treating the surface using oxygen $O_2$ plasma prior to bond the insulating substrate 10.

Next, the stacked structure is reversed so that the insulating substrate 10 can be placed in a lower position. Next, the porous SiGe layer 25 is removed by selective etching. Here, an etchant for selectively etching the porous SiGe layer 25 is a mixed solution of 50% HF:60% $HNO_3$:$H_2O$=1: 90~120:60. Other etchants that can selectively etch the porous SiGe layer 25 can also be used. Here, the etchant readily reacts with the porous SiGe layer 25 by being absorbed by the porous SiGe layer 25.

Figure 3L:
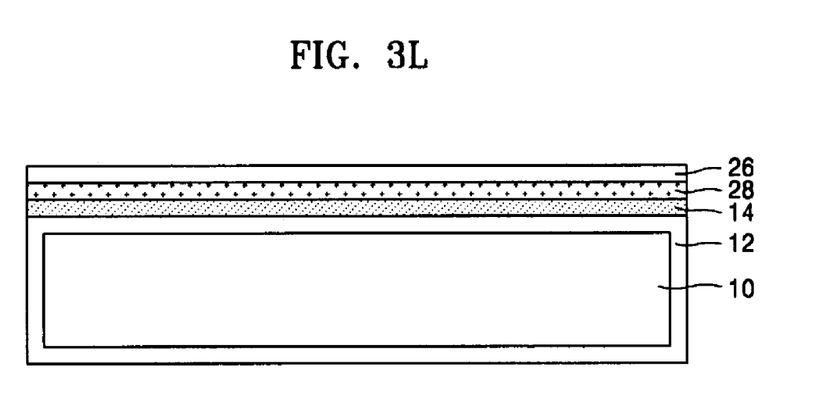

The Si substrate 20 formed on the porous SiGe layer 25 can be separated from the strained silicon layer 26 by selectively removing the porous SiGe layer 25. As a result, as depicted in FIG. 3L, a strained SOI structure formed on the insulating substrate 10 can be obtained.

FIGS. 4A through 4L are cross-sectional views illustrating a method of manufacturing a strained SOI structure according to a third embodiment of the present invention. Here, like reference numerals refer to like elements throughout the drawings. The formation of material layers during the processes is formed using a well known thin film deposition apparatus such as UHV-CVD or LPCVD.

Figure 4A:
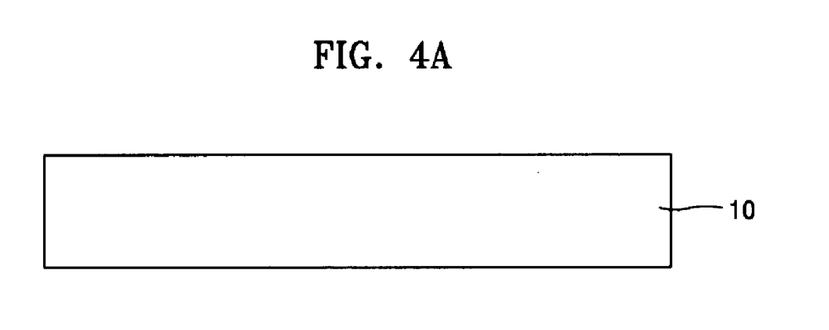
FIGS. 4A through 4L are cross-sectional views illustrating a method of manufacturing a strained SOI structure according to a third embodiment of the present invention.
Figure 4B:
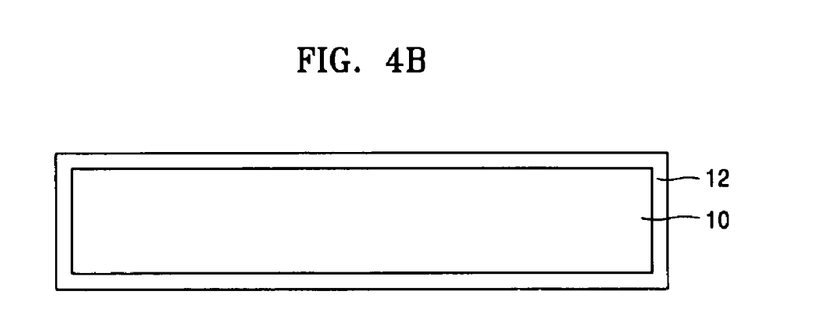
Figure 4C:
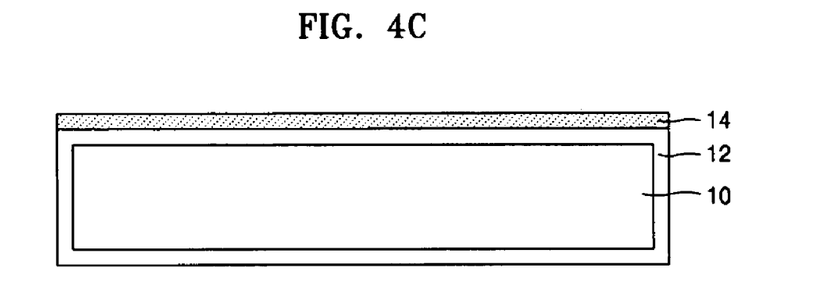
Figure 4D:
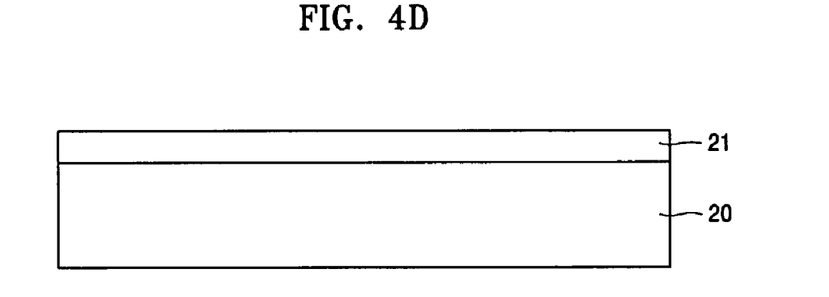
Figure 4E:
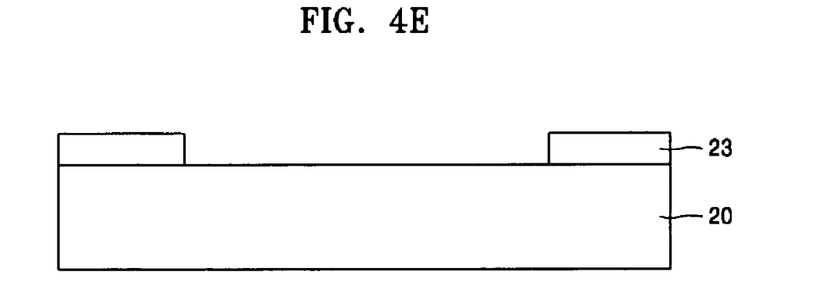
Figure 4F:
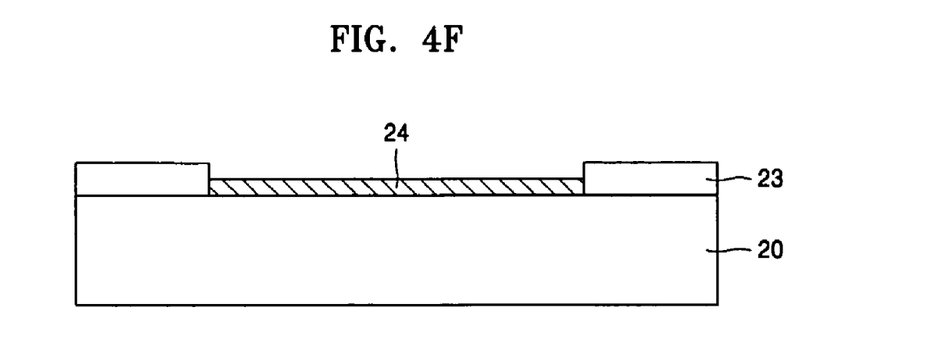
Figure 4G:
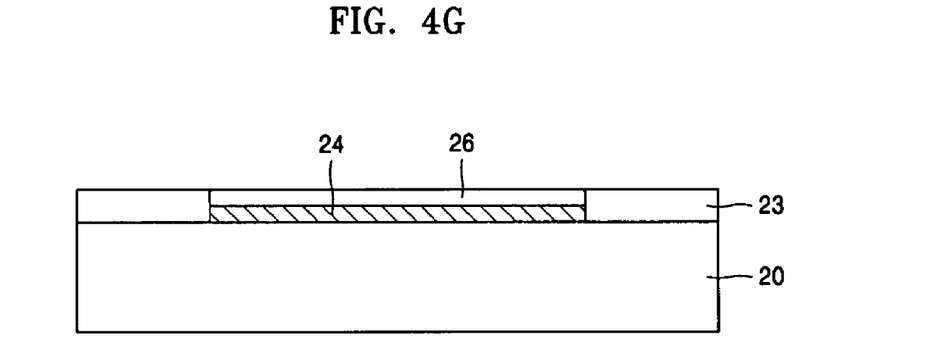
Figure 4H:
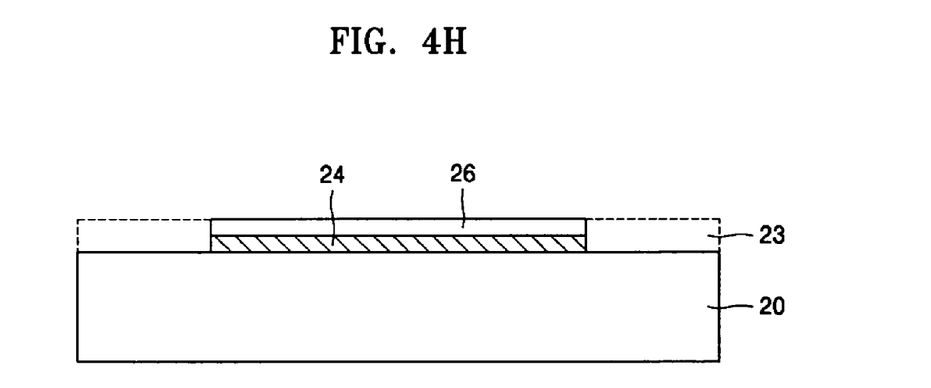
Figure 4I:
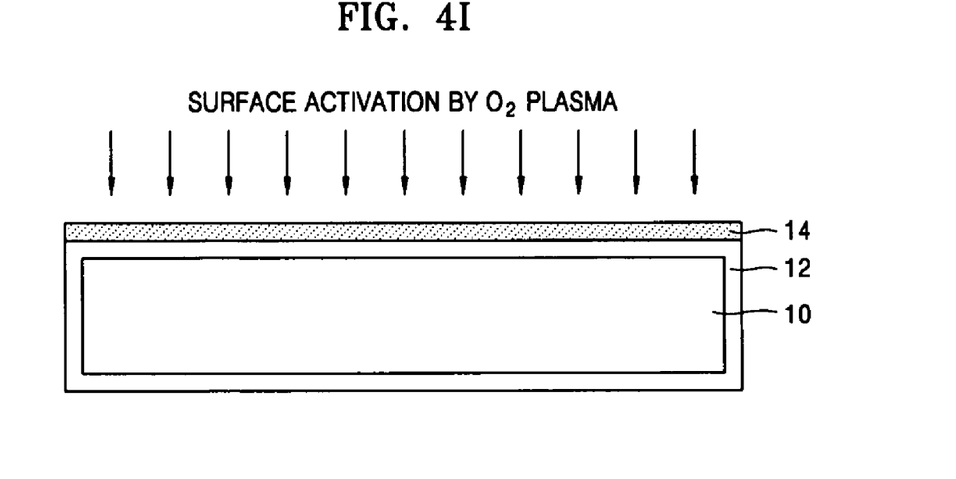
Figure 4J:
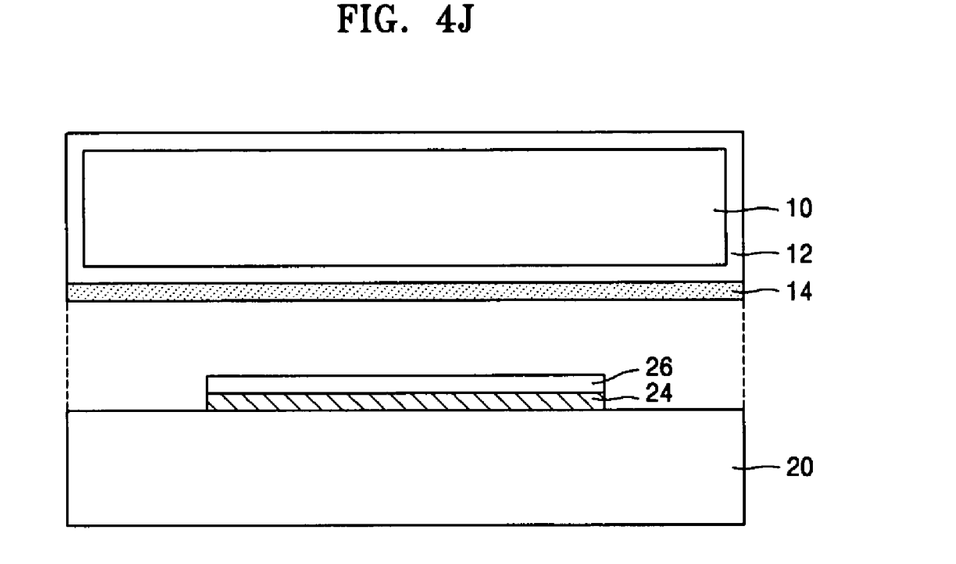
Figure 4K:
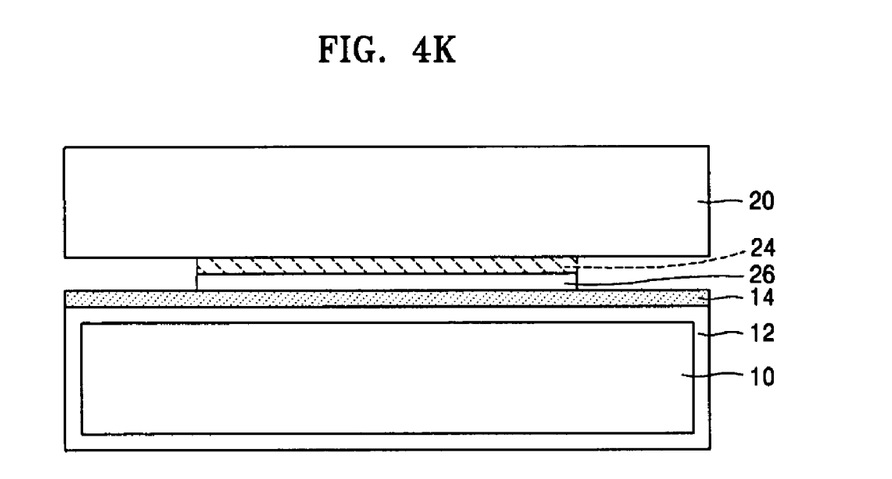

Referring to FIGS. 4A through 4C, after preparing the insulating substrate 10, the protective layer 12 is formed on the insulating substrate 10. The protective layer 12 is formed of a material having characteristics of insulating, transparent, and resistance to an etchant, such as AlN. The bonding layer 14 formed of $SiO_2$ or polycrystalline silicon is formed on the protective layer 12. The protective layer 12 and the bonding layer 14 are not requisite.

Referring to FIGS. 4D through 4H, after preparing the Si substrate 20, a $SiO_2$ layer 21 having a predetermined thickness is formed on the Si substrate 20. At least two $SiO_2$ barrier ribs 23 spaced a predetermined distance from each other are formed by patterning the $SiO_2$ layer 21. A SiGe layer 24 and a strained silicon layer 26 are sequentially formed on the Si substrate 20 between the two $SiO_2$ barrier ribs 23. Here, the SiGe layer 24 has a relaxed structure. Accordingly, the strained silicon layer 26 can be formed on the SiGe layer 24. Afterward, the $SiO_2$ barrier ribs 23 are removed.

Referring to FIGS. 4I through 4L, a surface of the bonding layer 14 formed on the insulating substrate 10 is activated by treating the surface using oxygen $O_2$ plasma. Next, the insulating substrate 10 is bonded on the strained silicon layer 26 formed on the Si substrate 20.

Next, the stacked structure is reversed so that the insulating substrate 10 can be placed in a lower position. Next, the SiGe layer 24 is removed by selective etching. Here, an etchant for selectively etching the SiGe layer 24 is a mixed solution of 50% HF:60% $HNO_3$:$H_2O$=1:90~120:60. Other etchants that can selectively etch the SiGe layer 24 can also be used.

Figure 4L:
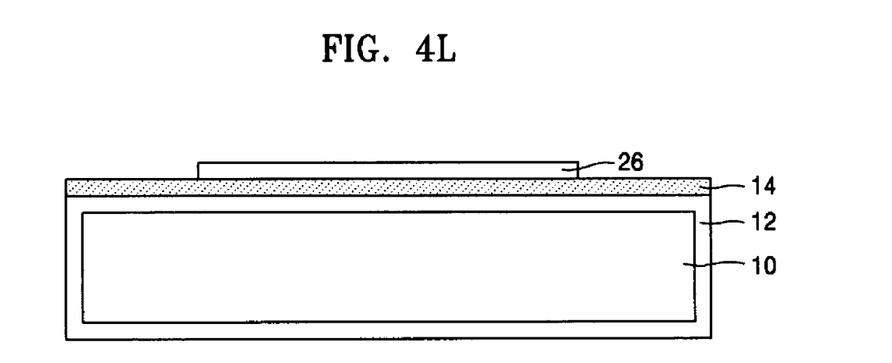

The Si substrate 20 formed on the SiGe layer 24 can be separated from the strained silicon layer 26 by selectively removing the SiGe layer 24. As a result, as depicted in FIG. 4L, a strained SOI structure formed on the insulating substrate 10 can be obtained.

The method of manufacturing a strained SOI structure according to embodiments of the present invention can readily form the strained SOI structure on an insulating substrate since the process for separating the substrate is as simple as that the SiGe layer can be removed by selective etching after a bonding process. Also, the method of manufacturing a strained SOI structure can use conventional manufacturing facilities without additional cost for equipment. Especially, the strained SOI structure can be formed on a substrate such as a plastic substrate or a glass substrate, which is weak to heat, since the method does not include an annealing process at a temperature higher than a conventional temperature of 1100° C. The strained SOI structure can be applied to a front substrate or a rear substrate of a display panel.

According to the present invention, a strained SOI structure formed on an insulating substrate such as a plastic substrate, a glass substrate, or a Si substrate on which an oxide layer is formed is provided. The strained SOI structure formed on the insulating substrate has high performance, a small parasite capacitance, and high carrier mobility. Also, the strained SOI structure can be applied to memory devices and semiconductor devices for next generation.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A method of manufacturing a strained SOI structure, comprising:
   preparing a Si substrate and an insulating substrate;
   forming a porous silicon layer by anodizing a predetermined thickness of the Si substrate;
   forming a SiGe layer on the porous silicon layer;
   forming a strained silicon layer on the SiGe layer;
   forming a $SiO_2$ layer on the strained silicon layer;
   activating a surface of the $SiO_2$ layer by treating the surface of the $SiO_2$ layer using oxygen $O_2$ plasma;
   bonding the insulating substrate on the activated $SiO_2$ layer;
   removing the SiGe layer by selectively etching; and
   separating the porous silicon layer and the Si substrate from the strained silicon layer.

2. The method of claim 1, wherein the insulating substrate is a substrate selected from the group consisting of a glass substrate, a plastic substrate, and a Si substrate on which an oxide layer is formed.

3. The method of claim 1, wherein the preparing of the insulating substrate includes:
   preparing an insulating substrate; and
   forming a protective layer on a surface of the insulating substrate.

4. The method of claim 3, wherein the protective layer is formed of AlN.

5. The method of claim 1, wherein the preparing of the insulating substrate includes:
    preparing an insulating substrate;
    forming a protective layer on a surface of the insulating substrate; and
    forming a bonding layer on the protective layer.

6. The method of claim 5, wherein the bonding layer is formed from at least one of $SiO_2$ and polycrystalline silicon.

7. A method of manufacturing a strained SOI structure, comprising:
    preparing a Si substrate and an insulating substrate;
    forming a first layer on the Si substrate, wherein the first layer is one of (1) a porous silicon layer formed by anodizing a predetermined thickness of the Si substrate and (2) a SiGe layer on the Si substrate;
    forming a second layer on the first layer, wherein the second layer is (1) a SiGe layer, when the first layer is a porous silicon layer and (2) a porous SiGe layer formed by anodizing a predetermined thickness of the SiGe layer, when the first layer is a SiGe layer;
    forming a strained silicon layer on the second layer;
    forming a $SiO_2$ layer on the strained silicon layer;
    activating a surface of the $SiO_2$ layer by treating the surface of the $SiO_2$ layer using oxygen $O_2$ plasma;
    bonding the insulating substrate on the activated $SiO_2$ layer;
    removing the second layer by selectively etching; and
    separating the first layer and the Si substrate from the strained silicon layer.

8. A method of manufacturing a strained SOI structure, comprising:
    preparing a Si substrate and an insulating substrate;
    forming a first layer on the Si substrate, wherein the first layer is one of (1) a porous silicon layer formed by anodizing a predetermined thickness of the Si substrate and (2) an $SiO_2$ layer, which is patterned to form at least two $SiO_2$ barrier ribs spaced a predetermined distance from each other, on the Si substrate;
    forming a SiGe layer on (1) the first layer when the first layer is a porous silicon layer and (2) on the Si substrate between the two barrier ribs when the first layer is an $SiO_2$ layer;
    forming a strained silicon layer on the SiGe layer;
    (1) forming a $SiO_2$ layer on the strained silicon layer and activating a surface of the $SiO_2$ layer by treating the surface of the $SiO_2$ layer using oxygen $O_2$ plasma when the first layer is a porous silicon layer or (2) removing the $SiO_2$ barrier ribs when the $SiO_2$ barrier ribs are present;
    bonding the insulating substrate on (1) on the activated $SiO_2$ layer when present or (2) the strained silicon layer when $SiO_2$ barrier ribs have been removed;
    removing the SiGe layer by selectively etching; and
    separating the Si substrate from the strained silicon layer.

* * * * *